(12) United States Patent
Eisenbeis et al.

(10) Patent No.: US 8,570,770 B2
(45) Date of Patent: Oct. 29, 2013

(54) OPTO-ISOLATOR MULTI-VOLTAGE DETECTION CIRCUIT

(75) Inventors: Clyde T. Eisenbeis, Marshalltown, IA (US); Stephen G. Seberger, Marshalltown, IA (US)

(73) Assignee: Fisher Controls International LLC, Marshalltown, IA (US)

( * ) Notice: Subject to any disclaimer, the term of this patent is extended or adjusted under 35 U.S.C. 154(b) by 1038 days.

(21) Appl. No.: 12/469,940

(22) Filed: May 21, 2009

(65) Prior Publication Data

US 2009/0289575 A1 Nov. 26, 2009

Related U.S. Application Data

(60) Provisional application No. 61/055,751, filed on May 23, 2008.

(51) Int. Cl.
*H02M 3/335* (2006.01)
*G05F 1/00* (2006.01)

(52) U.S. Cl.
USPC ........................................ 363/21.07; 315/291

(58) Field of Classification Search
USPC ................ 315/77, 291, 294, 307; 326/26–34, 326/82–87; 363/21.07, 21.06, 21.05, 21.15
See application file for complete search history.

(56) References Cited

U.S. PATENT DOCUMENTS

| | | | | |
|---|---|---|---|---|
| 4,336,461 A * | 6/1982 | Ida | ................................ | 250/551 |
| 4,395,660 A * | 7/1983 | Waszkiewicz | ................ | 315/291 |
| 4,649,302 A * | 3/1987 | Damiano et al. | .............. | 327/434 |
| 5,401,394 A | 3/1995 | Markham | | |
| 5,475,579 A * | 12/1995 | John et al. | .................. | 363/21.07 |
| 5,689,957 A * | 11/1997 | DeVilbiss et al. | ............... | 62/3.7 |
| 5,834,973 A | 11/1998 | Klatser et al. | | |
| 5,889,382 A | 3/1999 | Jung | | |
| 6,813,170 B2 * | 11/2004 | Yang | .......................... | 363/56.09 |
| 7,751,161 B2 * | 7/2010 | Williams | ........................ | 361/42 |
| 7,933,106 B2 * | 4/2011 | Brown et al. | ................. | 361/111 |

(Continued)

FOREIGN PATENT DOCUMENTS

| | | |
|---|---|---|
| CN | 1174439 | 2/1998 |
| CN | 1430064 | 7/2003 |

(Continued)

OTHER PUBLICATIONS

"SIPMOS® Small-Signal-Transistor." Infineon Technologies. Apr. 3, 2003—Rev. 1.0. pp. 1-9.
"SIPMOS® Small-Signal-Transistor." Infineon Technologies. Jan. 18, 2007—Rev. 1.5. pp. 1-9.
"Surface Mount Standard Recovery Power Rectifier." ON Semiconductor™. Apr. 2002—Rev. 2. pp. 1-4.

(Continued)

*Primary Examiner* — Thienvu Tran
(74) *Attorney, Agent, or Firm* — Marshall, Gerstein & Borun LLP

(57) ABSTRACT

An opto-isolator multi-voltage detection circuit is capable to handle a wide range of input voltages ranging from about 9 volts DC to about 240 volts AC includes an input voltage, an opto-isolator, a rectifier, a voltage divider, first and second transistors, and a DC to DC converter. The voltage divider operatively coupled to the first and second transistors is capable of evenly dividing the input voltage across the first and second transistors. The DC to DC converter operatively coupled to the transistors, the voltage divider, and the opto-isolator is capable of maintaining an output current from the rectifier. The use of the DC to DC converter, the voltage divider, and the transistors provide benefit of reducing a power dissipated throughout the entire circuit.

18 Claims, 4 Drawing Sheets

(56) References Cited

U.S. PATENT DOCUMENTS

| | | | |
|---|---|---|---|
| 2002/0067172 A1 | 6/2002 | Alker | |
| 2003/0122591 A1 | 7/2003 | Nakata et al. | |
| 2004/0212321 A1* | 10/2004 | Lys et al. | 315/291 |
| 2004/0257155 A1* | 12/2004 | McEwen | 330/59 |
| 2006/0132061 A1* | 6/2006 | McCormick et al. | 315/291 |
| 2008/0284400 A1* | 11/2008 | Oettinger et al. | 323/283 |
| 2010/0039833 A1* | 2/2010 | Coulson et al. | 363/21.05 |

FOREIGN PATENT DOCUMENTS

| | | |
|---|---|---|
| JP | 10-206471 A | 8/1988 |
| JP | 04012716 U | 1/1992 |
| JP | 04-364476 A | 12/1992 |
| JP | 2002082131 A | 3/2002 |
| JP | 2008228371 A | 9/2008 |

OTHER PUBLICATIONS

"Watt Plastic Surface Mount Zener Voltage Regulators." ON Semiconductor™. May 2001—Rev. 1. pp. 1-8.

"High CMR, High Speed TTL Compatible Optocouplers." Avago Technologies. 2005-2008, pp. 1-22.

"Isolated Voltage/Current Detectors." Avago Technologies. 2005-2009, pp. 1-14.

International Search Report for PCT/US2009/044726, mailed Dec. 30, 2009.

Written Opinion for PCT/US2009/044726, mailed Dec. 30, 2009.

First Office Action in Chinese Patent Application No. 200980118632.5 dated Sep. 11, 2012.

Office Action in JP2011510689 dated Jul. 16, 2013 with English summary.

* cited by examiner

OPTO-ISOLATOR MULTI-VOLTAGE DETECTION CIRCUIT

FIELD OF THE INVENTION

The present invention relates to voltage detection devices and, more particularly, to an opto-isolator multi-voltage detection circuit that provides voltage detection.

BACKGROUND

There exists a wide variety of power sources for powering electronic devices. For example, in the United States and Japan the standard AC voltage is 10V, while the AC standard voltage in Europe, Australia and other countries is 240V. When connecting an electronic device to a power source or any electric circuit, it may be beneficial to confirm the presence of the required voltage to the electronic device.

Presently, available low voltage detector circuits are used to detect the presence of a voltage from a power source. An opto-isolator is an electrical component typically used in a low voltage detector circuit to optically transfer a signal between an input and an output circuit, such as between a low voltage and a high voltage circuit. The opto-isolator helps to electromagnetically isolate the circuits from one another and from potentially destructive voltage spikes. Unlike a voltage transformer, an opto-isolator removes ground loops and excess noise or electromagnetic interference (EMI), and provides protection from serious over voltage conditions. Generally, a voltage detector circuit includes an opto-isolator to detect the presence of a voltage, and also includes a sensing resistor in series with the opto-isolator. The use of the sensing resistor may be undesirable in some applications because the resistor must handle an excessive power dissipation which leads to high impedance noise pulses. Unfortunately, a sensing resistor is expensive, and typically dissipates a substantial amount of heat.

SUMMARY OF THE INVENTION

According to one aspect of the invention, an opto-isolator multi-voltage detection circuit for use with 9 volt DC through 240 volt AC input voltages from a voltage source includes an opto-isolator, a diode connected to the voltage source, and a first transistor. The opto-isolator is configured to detect the presence of the voltage source and current flowing forward from the diode biases a light-emitting diode (LED) of the opto-isolator, and consequently any power dissipated through the first transistor in response to the input voltage is maintained at or below an acceptable level.

The opto-isolator multi-voltage detection circuit may further incorporate a converter such as a DC to DC converter. The DC to DC converter may provide the further benefit of reducing system crosstalk and power dissipation.

The opto-isolator multi-voltage detection circuit may further incorporate a second transistor and a voltage divider. The voltage divider may be operatively coupled to the first and second transistors and is configured to divide the input voltage across the first and second transistors. The voltage divider may provide the further benefit of reducing the power dissipated through the first and second transistors.

According to another aspect of the invention, an opto-isolator multi-voltage detection circuit for use with 9 volt DC through 240 volt AC input voltages from a voltage source includes a diode, first and second transistors, two zener diodes, and an opto-isolator coupled to the first and second transistors. The zener diodes may limit the input voltage to the first and second transistors providing an overall reduction in power dissipation and system crosstalk.

According to another aspect of the invention, an opto-isolator multi-voltage detection circuit for use with 9 volt DC through 240 volt AC input voltages from a voltage source includes a rectifier connected to the voltage source, an opto-isolator, first and second transistors, a voltage divider coupled to the first and second transistors, and a converter connected to the second transistor and the opto-isolator. The voltage divider is configured to divide the input voltage across the first and second transistors. The converter, such as a DC to DC converter, is configured to maintain an output current from the rectifier. When the output current from the rectifier forward biases a light-emitting diode (LED) of the opto-isolator, the first and second transistors are configured to reduce a power dissipated through the circuit such that a power dissipation of the first and second transistors is different from the power dissipated through the circuit.

BRIEF DESCRIPTION OF THE DRAWINGS

For a more complete understanding of the disclosure, reference should be made to the following detailed description and accompanying drawings wherein.

DETAILED DESCRIPTION

Figure 1:
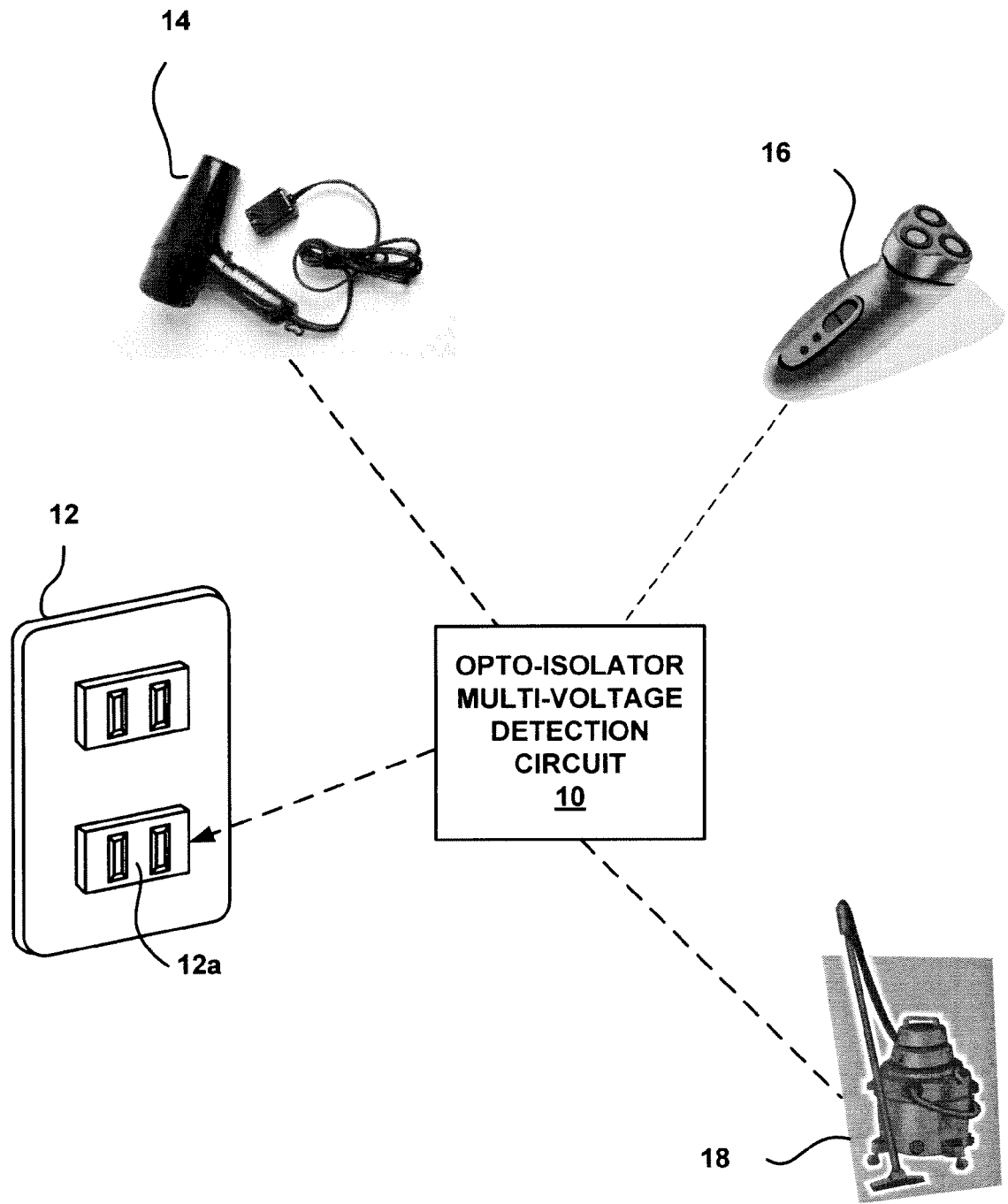
FIG. 1 is a perspective view of an opto-isolator multi-voltage detection device that may be used to connect any one of a variety of electronic devices to a voltage source.

FIG. 1 schematically depicts an exemplary opto-isolator multi-voltage detection circuit 10 assembled in accordance with the teachings of the invention. The circuit 10 may be used to connect any one of a variety of electronic devices to a voltage source 12. The circuit 10 may be a stand-alone circuit that connects virtually any type of electronic device to a socket 12a of the voltage source 12. Alternatively, the circuit 10 may be a built-in circuit disposed inside the electronic device, with the electronic device directly connectable to the socket 12a. Exemplary electronic devices include a hair dryer 14, a shaver 16, a vacuum cleaner 18 or other consumer electronic devices.

Figure 2:
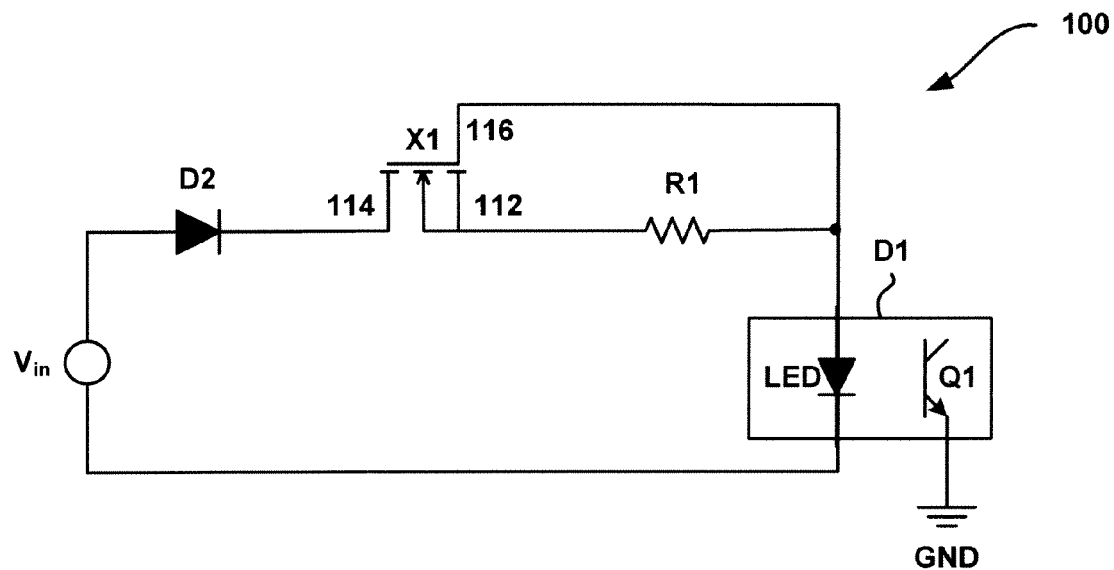
FIG. 2 is a schematic illustration of an opto-isolator multi-voltage detection device assembled in accordance with the teachings of the invention.

FIG. 2 depicts an exemplary opto-isolator multi-voltage detection circuit 100 assembled in accordance with the teachings of the invention. The circuit 100 includes an opto-isolator D1, which is preferably part number HCPL-2360, as sold by Avago Technologies Limited. Typically, the opto-isolator D1 includes a light emitting diode LED and a phototransistor Q1. When using the preferred opto-isolator, the opto-isolator can detect current ranging from about 1.2 mA to about 50 mA. Other sizes may be chosen in order to detect current across a different range. In turn, the current drives the LED to light.

The circuit 100 further includes a diode D2, a resistor R1, and a transistor X1. The transistor X1 may be an N-channel depletion field-effect transistor (FET), which is preferably part number BSS139, as sold by Infineon Technologies AG. The transistor X1 has a source terminal 112, a drain terminal 114, and a gate terminal 116. The diode D2, which may be a surface mount standard recovery power rectifier diode, is connected to the drain terminal 114 of the transistor X1. The diode D2 is preferably part number MRA4007T3, as sold by Semiconductor Components Industries, LLC. The gate terminal 116 of the transistor X1 and one end of the resistor R1 are connected to one end of the opto-isolator D1. The other end of the opto-isolator D1 is connected to a ground GND. The source terminal 112 of the transistor X1 is connected to the other end of the resistor R1. The resistor R1 is preferably 768 ohm, although other resistance values are contemplated. An input $V_{in}$ is connected to the diode D2.

Operation of the circuit 100 is now described. The circuit 100 is used to handle a wide range of input voltages ranging from about 9 volt DC through 240 volt AC in accordance with the teachings of the invention. For example, when an input of approximately 250 $V_{ac}$ rms (approximately 350 $V_{ac}$ peak) is applied to the circuit 100, a current starts to flow through the diode D2, the transistor X1, the resistor R1, and the opto-isolator D1. As a result, the current that flows through the opto-isolator D1 ranges from about 1.3 mA to about 2.7 mA, thereby causing the LED of the opto-isolator D1 to light. A voltage Vgs across the transistor X1 ranges from about −1 volt to about −2.1 volts. Consequently, a power dissipated through the transistor X1 is approximately 338 mW, which is marginally close to the power rating (360 mW) of the transistor X1.

To further reduce the power dissipation, the transistor X1 may be larger than the exemplary BSS139 transistor discussed above. For example, the transistor X1 may be part number BSS126, as sold by Infineon Technologies AG, which has a higher power of about 500 mW and a higher voltage Vds of about 600 volts. A larger resistor also may be used. One exemplary larger resistor may have a resistance of about 1.23 kohms. When the larger transistor and resistor are used and an input of approximately 250 $V_{ac}$ rms (approximately 350 $V_{ac}$ peak) is applied to the circuit 100, a current starts to flow through the diode D2, the transistor, the resistor, and the opto-isolator D1. As a result, the current that flows through the opto-isolator D1 ranges from about 1.3 mA to about 2.2 mA and a voltage Vgs across the transistor ranges from about −1.6 volts to about −2.7 volts. Consequently, the power dissipated through the transistor is approximately 275 mW, which is half of the power rating (500 mW) of the transistor. Again, the use of the high power and high voltage transistor may provide the further benefit of reducing a power dissipated through the transistor X1.

Figure 3:
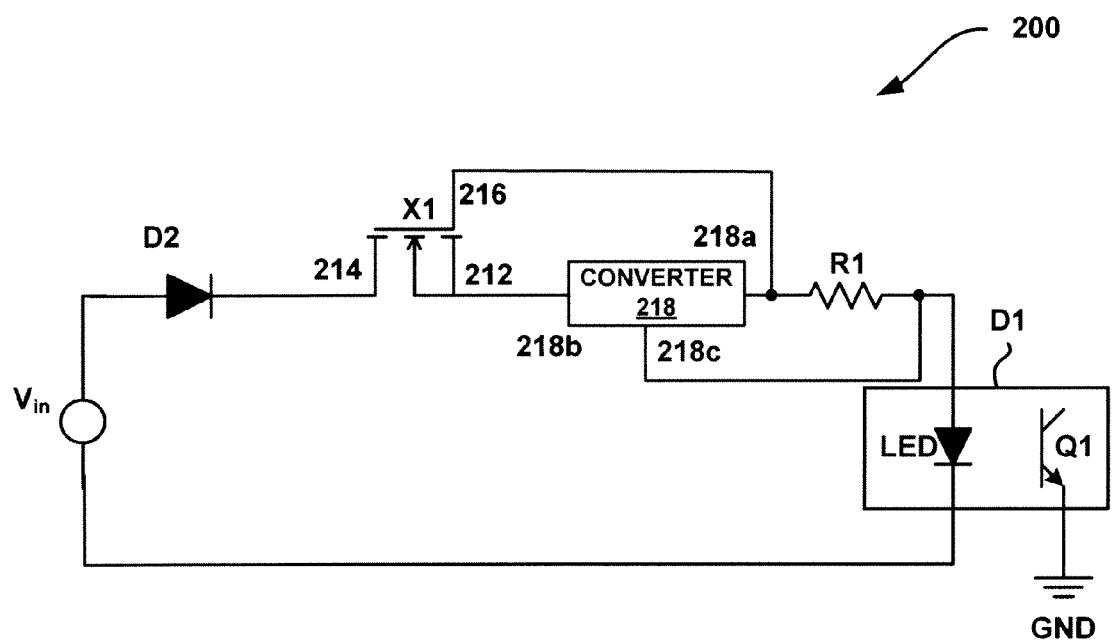
FIG. 3 is a schematic illustration of another embodiment of an opto-isolator multi-voltage detection device assembled in accordance with the teachings of the invention.

FIG. 3 depicts an opto-isolator multi-voltage detection circuit 200 assembled in accordance with the teachings of another exemplary embodiment of the invention. The circuit 200 includes an opto-isolator D1, which is preferably part number HCPL-2360, as sold by Avago Technologies Limited. Typically, the opto-isolator D1 includes a light emitting diode LED and a phototransistor Q1. When using the preferred opto-isolator, the opto-isolator again can detect the current ranging from about 1.2 mA to about 50 mA, and the current again drives the LED to light. The circuit 200 further includes a diode D2, a resistor R1, a transistor X1, and a DC to DC converter 218. The transistor X1 may be the N-channel depletion field-effect transistor (FET), which is the BSS139 transistor sold by Infineon Technologies AG discussed above. The transistor X1 has a source terminal 212, a drain terminal 214, and a gate terminal 216. The diode D2, such as a surface mount standard recovery power rectifier diode, is connected to the drain terminal 214 of the transistor X1. The diode D2 is preferably part number MRA4007T3, as sold by Semiconductor Components Industries, LLC. The gate terminal 216 of the transistor X1 is connected to one end of the resistor R1 and to a first end 218a of the DC to DC converter 218. A second end 218b of the DC to DC converter 218 is connected to the source terminal 212 of the transistor X1. A third end 218c of the DC to DC converter 218 is connected to the other end of the resistor R1 and to one end of the opto-isolator D1. The other end of the opto-isolator D1 is connected to a ground GND. The resistor R1 in this case is preferably much larger with respect to the resistor in FIG. 1. The resistor R1 is preferably 3.8 kohm, although other resistance values are contemplated. The DC to DC converter 218 is preferably rated at 5 volts, although other voltage values are contemplated. An input $V_{in}$ is connected to the other end of the diode D2.

Operation of the circuit 200 is now described. The circuit 200 is used to handle a wide range of input voltages ranging from about 9 volt DC through 240 volt AC in accordance with the teachings of the invention. For example, when an input of approximately 250 $V_{ac}$ rms (approximately 350 $V_{ac}$ peak) is applied to the circuit 200, a current starts to flow through the diode D2, the transistor X1, the resistor R1, the DC to DC converter 218, and the opto-isolator D1. As a result, the DC to DC converter keeps the current that flows through the opto-isolator D1 at approximately 1.3 mA. The DC to DC converter also keeps the power dissipation at the transistor X1 at approximately 163 mW which is below the power rating (360 mW) of the transistor. The use of the DC to DC converter 218 may provide the benefit of maintaining the current flow through the circuit 100 thus providing an overall reduction in system crosstalk and power dissipation.

Figure 4:
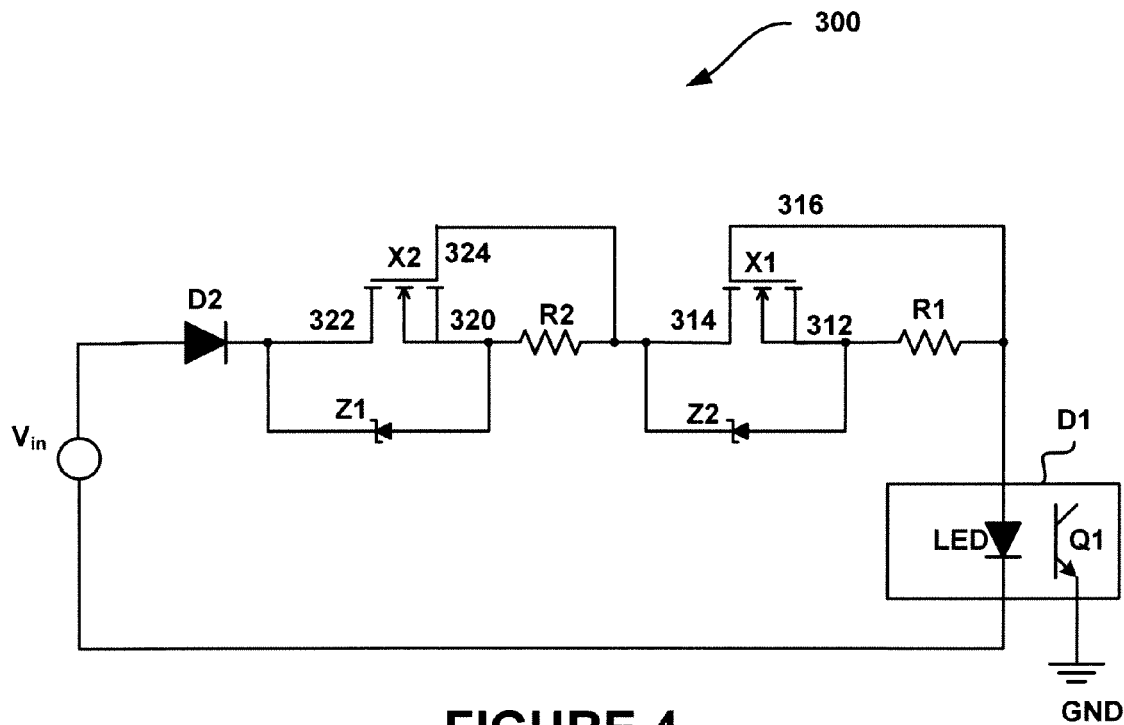
FIG. 4 is a schematic illustration of another embodiment of an opto-isolator multi-voltage detection device assembled in accordance with the teachings of the invention.

FIG. 4 depicts an opto-isolator multi-voltage detection circuit 300 assembled according to the teachings of yet another exemplary form of the invention. The circuit 300 includes an opto-isolator D1, which is preferably the Avago Technologies Limited part number HCPL-2360 discussed above. The opto-isolator D1 includes a light emitting diode LED and a phototransistor Q1. Once again, when using the preferred opto-isolator, the opto-isolator can detect the current ranging from about 1.2 mA to about 50 mA. The circuit 300 further includes a diode D2, a first zener diode Z1, a second zener diode Z2, a first resistor R1, a second resistor R2, a first transistor X1, and a second transistor X2. The first and second transistors X1, X2 connected in series preferably are N-channel depletion field-effect transistors (FETs) which again may be part number BSS139, as sold by Infineon Technologies AG. The first transistor X1 has a source terminal 312, a drain terminal 314, and a gate terminal 316. The second transistor X2 also has a source terminal 320, a drain terminal 322, and a gate terminal 324. The diode D2, such as a surface mount standard recovery power rectifier diode, is connected to the drain terminal 322 of the transistor X2 and to one end of the zener Z1. The other end of the zener Z1 is connected to the source terminal 320 of the transistor X2 and to one end of the resistor R2. The other end of the resistor R2 is connected to the gate terminal 324 of the transistor X2. The diode D2 is preferably the part number MRA4007T3 discussed above and made by Semiconductor Components Industries, LLC. An input $V_{in}$ is connected to the other end of the diode D2.

One end of the zener diode Z1 is connected to the drain terminal 314 of the transistor X1. The other end of the zener diode Z1 is connected to the source terminal 312 of the transistor X1 and to one end of the resistor R1. The other end of the resistor R1 is connected to the gate terminal 316 of the transistor X1 and to one end of the opto-isolator D1. The other end of the opto-isolator D1 is connected to a ground GND. The resistor R1 in this case is preferably 768 ohm, while the resistor R2 is preferably 750 Ohm, although other resistance values are contemplated. The zener diodes Z1, Z2 are preferably part number ISMB5952BT3, as sold by Semiconductor Components Industries LLC, and have voltage and power ratings of 130 volts and 3 watts. Other voltage and power ratings are contemplated.

Operation of the circuit 300 is now described. With the addition of the second transistor X2 and the zener diodes Z1, Z2, when an input of approximately 250 $V_{ac}$ rms (approximately 350 $V_{ac}$ peak) is applied to the circuit 300, a current starts to flow through the diode D2, the transistors X1, X2, the zener diodes Z1, Z2, the resistors R1, R2, and the opto-isolator D1. As a result, the voltage measured across the transistors X1, X2 is below peak voltage (approximately 180 volts), while the current that flows through the opto-isolator D1 varies from about 1.3 mA to about 2.7 mA. This yields a power dissipation of 173 mW for the transistors X1, X2. The use of the zener diodes Z1, Z2 may provide the benefit of limiting the input voltage to the first and second transistors X1, X2. The use of the transistors X1, X2 may provide the benefit an overall reduction in system crosstalk and power dissipation.

Figure 5:
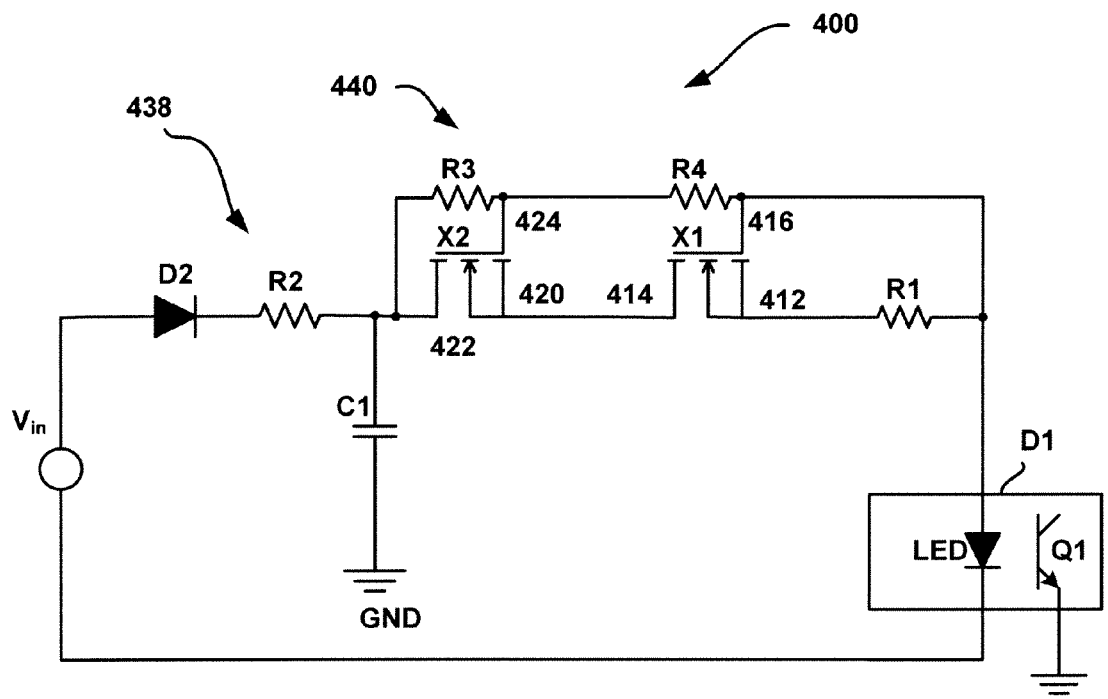
FIG. 5 is a schematic illustration of another embodiment of an opto-isolator multi-voltage detection device assembled in accordance with the teachings of the invention.

FIG. 5 depicts an opto-isolator multi-voltage detection circuit 400 assembled in accordance with the teachings of yet another example of the invention. The circuit 400 includes an opto-isolator D1, which again is preferably part number HCPL-2360, as sold by Avago Technologies Limited. Typically, the opto-isolator D1 includes a light emitting diode LED and a phototransistor Q1. The preferred opto-isolator can detect the current ranging from about 1.2 mA to about 50 mA, and in turn the current drives the LED to light. The circuit 400 further includes a diode D2, a capacitor C1, a first resistor R1, a second resistor R2, a third resistor R3, a fourth resistor R4, a first transistor X1, and a second transistor X2. The diode D2, resistor R2, and capacitor C1 constitute a rectifier 438 while resistors R3 and R4 constitute a voltage divider 440. The first and second transistors X1, X2 connected in series again may be the foregoing N-channel depletion field-effect transistors (FETs). The first transistor X1 has a source terminal 412, a drain terminal 414, and a gate terminal 416. The second transistor X2 also has a source terminal 420, a drain terminal 422, and a gate terminal 424. The diode D2, such as a surface mount standard recovery power rectifier diode, is connected to one end of the resistor R2. An input $V_{in}$ is connected to the other end of the diode D2. The other end of the resistor R2 is connected to one end of the capacitor C1 and to the drain terminal 422 of the transistor X2. The other end of the capacitor C1 is connected to a ground GND. The capacitor C1 preferably has a capacitance of 0.01μ, although different values are contemplated.

The source terminal 420 of the transistor X2 is connected to the drain terminal 414 of the transistor X1. The gate terminal 424 of the transistor X2 connects the resistor R3 to the resistor R4. The other end of the resistor R3 is connected to the drain terminal 422 of the transistor X2. The source terminal 412 of the transistor X1 is connected to one end of the resistor R1. The other end of the resistor R1 is connected to the gate terminal 416 of the transistor X1 and to one end of the opto-isolator D1. The other end of the opto-isolator D1 is connected to a ground GND. The resistor R1 again preferably has a resistance of 768 ohms, while the resistance of the rest of the resistors R2, R3, R4 may be, for example, 1 Mohm, respectively, although other resistance values are contemplated.

Operation of the circuit 400 is now described. When an input of approximately 250 $V_{ac}$ rms (approximately 350 $V_{ac}$ peak) is applied to the circuit 400, a current starts to flow through the diode D2, the transistors X1, X2, the resistors R1, R2, R3, R4, and the opto-isolator D1. In this configuration, the current that flows through the opto-isolator D1 varies from approximately 1.3 mA to approximately 2.7 mA. Advantageously, the use of the voltage divider 440 to the transistors X1, X2 provides the benefit of evenly dividing the input voltage across the transistors X1, X2 at approximately half of the peak voltage (approximately 125 volts). This yields a power dissipation of approximately 169 mW for the transistors X1, X2. Thus, zener diodes are no longer required.

Figure 6:
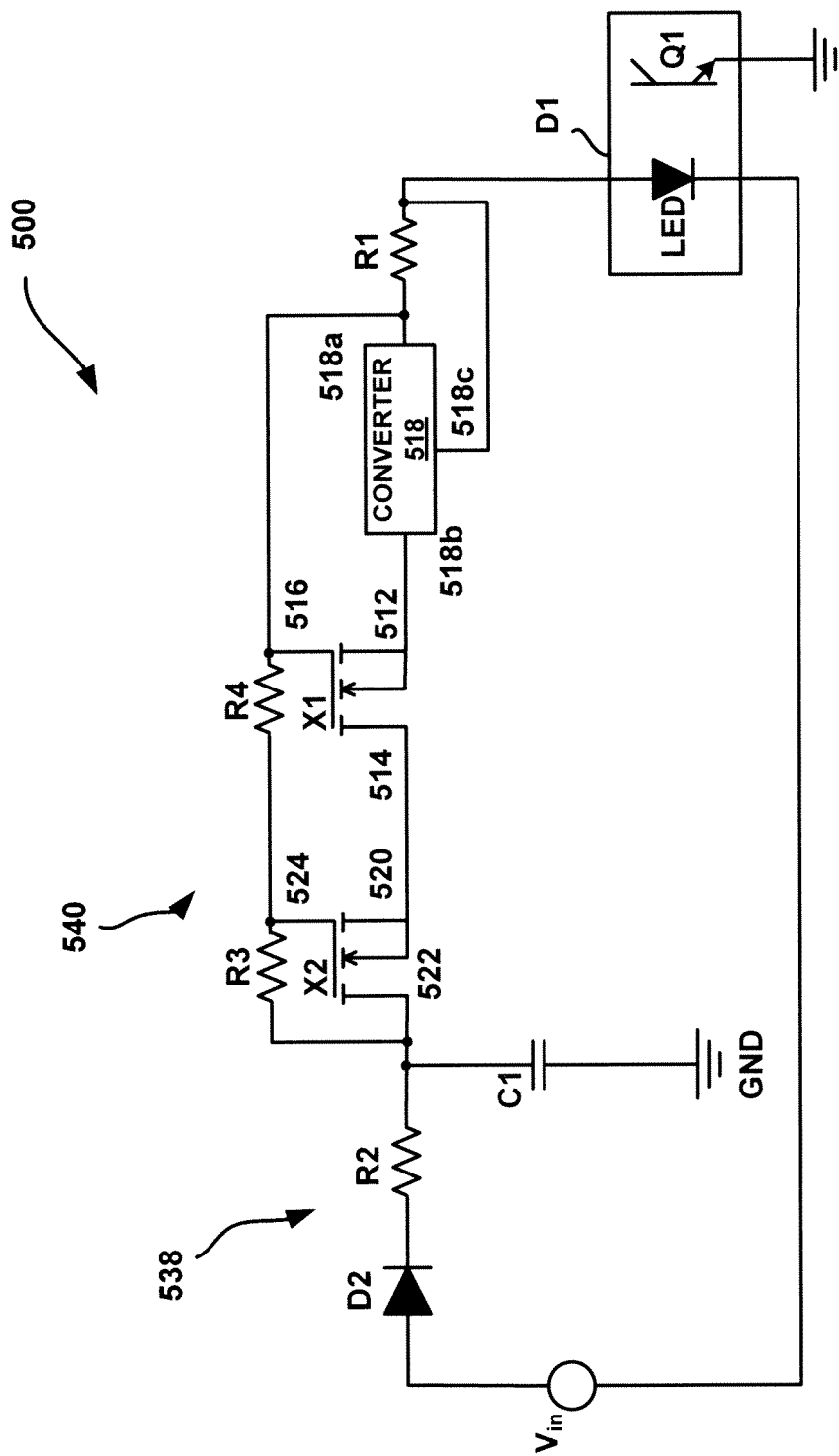
FIG. 6 is a schematic illustration of another embodiment of an opto-isolator multi-voltage detection device assembled in accordance with the teachings of the invention.

FIG. 6 depicts an opto-isolator multi-voltage detection circuit 500 assembled in accordance with the teachings of a still further example of the invention. The circuit 500 includes an opto-isolator D1, which is preferably the HCPL-2360 opto-isolator discussed above by Avago Technologies Limited which is capable of detecting a current ranging from about 1.2 mA to about 50 mA. Typically, the opto-isolator D1 includes a light emitting diode LED and a phototransistor Q1. The LED lights when the current ranging from about 1.2 mA to about 50 mA flows through the opto-isolator D1. The circuit 500 further includes a diode D2, a capacitor C1, a first resistor R1, a second resistor R2, a third resistor R3, a fourth resistor R4, a first transistor X1, a second transistor X2, and a DC to DC converter 518. The diode D2, the resistor R2, and the capacitor C1 constitute a rectifier 538 while the resistors R3, R4 constitute a voltage divider 540. The first and second transistors X1, X2, connected in series, again may be the N-channel depletion field-effect transistors (FETs) discussed above and sold by Infineon Technologies AG. The first transistor X1 has a source terminal 512, a drain terminal 514, and a gate terminal 516. The second transistor X2 also has a source terminal 520, a drain terminal 522, and a gate terminal 524. The diode D2, which may be a surface mount standard recovery power rectifier diode, is connected to one end of the resistor R2. An input $V_{in}$ is connected to the other end of the diode D2. The other end of the resistor R2 is connected to one end of the capacitor C1 and to the drain terminal 522 of the transistor X2. The other end of the capacitor C1 is connected to a ground GND. The capacitor C1 has a capacitance of preferably 0.01μ, although different values are contemplated.

The source terminal 520 of the transistor X2 is connected to the drain terminal 514 of the transistor X1. The gate terminal 524 of the transistor X2 connects the resistor R3 to the resistor R4. The other end of the resistor R3 is connected to the drain terminal 522 of the transistor X2. The source terminal 512 of the transistor X1 is connected to a second end 518b of the DC to DC converter 518. The gate terminal 516 of the transistor X1 is connected to a first end 518a of the DC to DC converter 518 and to one end of the resistor R1. The third end 518c of the DC to DC converter 518 is connected to the other end of the resistor R1 and to one end of the opto-isolator D1. The other end of the opto-isolator D1 is connected to a ground GND. The resistor R1 in this case preferably has a resistance of about 3.8 kohm, while the rest of the resistors R2, R3, R4 preferably have a resistance of about 1 Mohm. The DC to DC converter 518 is preferably rated at 5 volts, although other voltage values are contemplated.

Operation of the circuit 500 is now described. When an input of approximately 250 $V_{ac}$ rms (approximately 350 $V_{ac}$ peak) is applied to the circuit 500, a current starts to flow through the diode D2, the transistors X1, X2, the resistors R1, R2, R3, R4, the DC to DC converter 518, and the opto-isolator D1. In this configuration, the voltage divider 540 evenly divides the input voltage across the transistors X1, X2, while the DC to DC converter 518 maintains the current that flows through the opto-isolator D1 at approximately 1.3 mA. Advantageously, the use of the transistors X1, X2 and the DC to DC converter 518 provide the benefit of yielding the power dissipation at approximately 82 mW. The use of the DC to DC converter 518 and the voltage divider 540 may provide benefit of maintaining the current flow through the circuit providing an overall reduction in system crosstalk and power dissipation.

When assembled in accordance with one or more of the example described herein, the opto-isolator multi-voltage detection circuit may provide the benefit of maintaining a current providing an overall reduction in power dissipation and system crosstalk. The circuit also may provide further benefit of evenly dividing an input voltage providing a further reduction in power dissipation and system crosstalk.

The preceding text sets forth a detailed description of numerous different embodiments of the invention, it should be understood that the legal scope of the invention is defined by the words of the claims set forth at the end of this patent. The detailed description is to be construed as exemplary only and does not describe every possible embodiment of the invention since describing every possible embodiment would be impractical, if not impossible. For example, it should be appreciated that the embodiments disclosed in FIG. 2 through FIG. 4 with provide constant excitation of the opto-isolator when the presence of a DC voltage is detected. However, the cyclic nature of an AC voltage will intermittently switch the opto-isolator (i.e. periodically excite the opto-isolator) in accordance with the periodicity of the signal. In the alternative, the embodiments of FIG. 5 and FIG. 6 will provide constant excitation; even in the presence of an AC signal due to the rectifying nature of capacitor C1. Numerous alternative embodiments could be implemented, using either current technology or technology developed after the filing date of this patent, which would still fall within the scope of the claims defining the invention.

The invention claimed is:

1. An opto-isolator multi-voltage detection circuit comprising:
   a voltage input, the voltage input arranged for connection to the voltage source;
   an opto-isolator having a light-emitting diode (LED), the opto-isolator configured to detect the presence of an input voltage applied to the voltage input from the voltage source;
   a diode, the diode arranged for connection to the voltage input;
   a first transistor having a gate, a source, and a drain, the drain of the first transistor operatively coupled to the diode, and the source of the first transistor operatively coupled to the opto-isolator;
   the opto-isolator, the diode, and the first transistor arranged such that a current flowing forward from the diode biases the LED, and further such that any power dissipated through the first transistor in response to the input voltage and to the current is maintained at or below an acceptable level for operation of the first transistor; and
   a DC to DC converter operatively coupled to the source of the first transistor and the opto-isolator, the DC to DC converter configured to maintain the current from the diode.

2. The circuit of claim 1, further comprising:
   a second transistor having a gate, a source, and a drain, the source of the second transistor serially coupled to the drain of the first transistor, the drain of the second transistor operatively coupled to the diode; and
   a voltage divider operatively coupled to the gates of the first and second transistors, the voltage divider configured to evenly divide the input voltage across the first and second transistors;
   wherein the power dissipated through the first transistor and further through the second transistor is maintained at or below an acceptable level for operation of the first and second transistors, and wherein the circuit is capable to handle the input voltage ranging from about 9 volt DC through 240 volt AC.

3. The circuit of claim 2, further comprising a rectifier, the rectifier operatively coupled to the diode, the voltage divider, and the drain of the second transistor.

4. The circuit of claim 3, wherein the rectifier comprises a resistor, or a capacitor, or a combination thereof.

5. The circuit of claim 3, wherein the first and second transistors are N channel depletion mode field-effect transistor (FET).

6. An opto-isolator multi-voltage detection circuit comprising:
   a voltage input, the voltage input arranged for connection to the voltage source;
   an opto-isolator having a light-emitting diode (LED), the opto-isolator configured to detect the presence of an input voltage applied to the voltage input from the voltage source;
   a diode, the diode arranged for connection to the voltage input; and
   a first transistor having a gate, a source, and a drain, the drain of the first transistor operatively coupled to the diode, and the source of the first transistor operatively coupled to the opto-isolator;
   the opto-isolator, the diode, and the first transistor arranged such that a current flowing forward from the diode biases the LED, and further such that any power dissipated through the first transistor in response to the input voltage and to the current is maintained at or below an acceptable level for operation of the first transistor; and
   a second transistor having a gate, a source, and a drain, the source of the second transistor operatively coupled to the drain of the first transistor; and
   a voltage divider operatively coupled to the gates of the first and second transistors;
   wherein the power dissipated through the first transducer and further through the second transistor is maintained at or below an acceptable level for operation of the first and second transistors, and wherein the circuit is capable to handle the input voltage ranging from about 9 volt DC through 240 volt AC.

7. The circuit of claim 6, further comprising a rectifier, the rectifier operatively coupled to the diode, the voltage divider, and the drain of the second transistor.

8. The circuit of claim 7, wherein the rectifier comprises a resistor, or a capacitor, or a combination thereof.

9. The circuit of claim 7, wherein the first and second transistors are N channel depletion mode field-effect transistor (FET).

10. An opto-isolator multi-voltage detection circuit comprising:
    a voltage input, the voltage input arranged for connection to the voltage source;
    an opto-isolator having a light-emitting diode (LED), the opto-isolator configured to detect the presence of an input voltage applied to the voltage input from the voltage source;
    a rectifier, the rectifier arranged for connection to the voltage input; and a first transistor and a second transistor operatively coupled in series, each transistor having a gate, a source, and a drain, the source of the first transistor operatively coupled to the drain of the second transistor, and the drain of the first transistor operatively coupled to the rectifier;

wherein a current output from the rectifier biases the LED, and wherein the first and second transistors are configured to dissipate a first power level across the first and second transistors, the first power level different than a second power level dissipated across the circuit.

11. The circuit of claim 10, further comprising a voltage divider operatively coupled to the gates of the first and second transistors and the rectifier, and wherein the first power level dissipated across the first and second transistors in response to the input voltage divided across the first and second transistors by the voltage divider is different than the second power level dissipated across the circuit.

12. The circuit of claim 11, wherein the rectifier comprises a capacitor, a resistor, and a diode operatively coupled in series, wherein the diode is connected to the voltage input, and wherein the capacitor is operatively coupled to the voltage divider and to at least one of the gates of the first and second transistors.

13. The circuit of claim 12, further comprising a DC to DC converter operatively coupled to the opto-isolator and at least one of the sources of the first and second transducers, and wherein the DC to DC converter is configured to maintain the current from the first and second transistors.

14. The circuit of claim 13, further comprising:
   first and second zener diodes operatively coupled to the first and second transistors, the first and second zener diodes configured to limit the input voltage to the first and second transistors.

15. The circuit of claim 14, wherein either the first zener diode or the second zener diode is operatively coupled to the rectifier, and wherein the rectifier comprises a diode.

16. An opto-isolator multi-voltage detection circuit comprising:
   a voltage input, the voltage input arranged for connection to the voltage source;
   an opto-isolator having a light-emitting diode (LED), the opto-isolator configured to detect the presence of an input voltage applied to the voltage input from the voltage source;
   a diode, a resistor, and a capacitor connected in series and cooperating to define a rectifier, the rectifier connected to the voltage input;
   a first transistor and a second transistor operatively coupled in series, each transistor having a gate, a source, and a drain, the source of the first transistor connected to the drain of the second transistor, and the drain of the first transistor connected to the rectifier;
   a voltage divider connected to the gates of the first and second transistors, the voltage divider configured to divide the input voltage across the first and second transistors; and
   a DC to DC converter connected to the source of the second transistor and the opto-isolator;
   wherein a current output from the DC to DC converter biases the LED, and wherein the first and second transistors are configured to dissipate a first power level across the first and second transistors, the first power level different than a second power level dissipated across the circuit.

17. A method for handling a variety of input voltages from a voltage source comprising:
   operatively coupling an opto-isolator to a voltage input to detect the presence of the input voltage applied to the voltage input from the voltage source;
   forward biasing a light-emitting diode (LED) of the opto-isolator when a current from a diode operatively coupled to the voltage input is detected;
   operatively coupling a first transistor to the diode and the opto-isolator;
   maintaining any power dissipated through the first transistor at or below an acceptable level for operation of the first transistor;
   operatively coupling a second transistor to the first transistor to maintain the power dissipation through the first transistor and further through the second transistor at or below the acceptable level;
   operatively coupling a voltage divider to the first and second transistors; and
   using a voltage divider to divide the input voltage across the first and second transistors, and maintaining the power dissipation through the first and second transistors at or below the acceptable level.

18. The method of claim 17 further comprising:
   operatively coupling a DC to DC converter to the first transistor and the opto-isolator for maintaining the current from the diode.

* * * * *

UNITED STATES PATENT AND TRADEMARK OFFICE
CERTIFICATE OF CORRECTION

PATENT NO. : 8,570,770 B2  
APPLICATION NO. : 12/469940  
DATED : October 29, 2013  
INVENTOR(S) : Clyde T. Eisenbeis et al.

Page 1 of 1

It is certified that error appears in the above-identified patent and that said Letters Patent is hereby corrected as shown below:

In the Specification:

At Column 1, line 14, "10V," should be -- 110V, --.

At Column 5, line 53, "0.01∥," should be -- 0.01μ, --.

In the Claims:

At Column 9, line 30, "claim 13," should be -- claim 10, --.

Signed and Sealed this
Eighth Day of September, 2015

Michelle K. Lee
*Director of the United States Patent and Trademark Office*